(12) United States Patent
Xiang et al.

(10) Patent No.: US 12,413,184 B2
(45) Date of Patent: Sep. 9, 2025

(54) ELECTRONIC APPARATUS AND PHOTOVOLTAIC POWER OPTIMIZER

(71) Applicant: Huawei Digital Power Technologies Co., Ltd., Shenzhen (CN)

(72) Inventors: Zhiqiang Xiang, Shenzhen (CN); Jiebin Cheng, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 207 days.

(21) Appl. No.: 18/455,917

(22) Filed: Aug. 25, 2023

(65) Prior Publication Data
US 2024/0072724 A1  Feb. 29, 2024

(30) Foreign Application Priority Data
Aug. 26, 2022 (CN) .......................... 202211033886.0

(51) Int. Cl.
*H02S 40/42* (2014.01)
(52) U.S. Cl.
CPC .................................. *H02S 40/425* (2014.12)
(58) Field of Classification Search
CPC .. H05K 1/02–0212; H05K 1/181; H05K 7/20; H05K 7/20409; H05K 7/20445; H05K 7/209; H05K 7/20909; H05K 2201/10166; H05K 2201/10174; H01L 23/057; H01L 23/3107; H01L 23/3121; H01L 23/3675; H01L 23/46; H01L 23/49811; H01L 23/5383; H01L 23/552; H01L 24/73; H01L 25/0655; H01L 25/072; H02S 40/425
See application file for complete search history.

(56) References Cited

U.S. PATENT DOCUMENTS

| | | | | |
|---|---|---|---|---|
| 11,019,756 | B2 * | 5/2021 | Hashii | H01L 25/072 |
| 2010/0238627 | A1 * | 9/2010 | Shinohara | H01L 24/73 |
| | | | | 361/688 |
| 2015/0216089 | A1 * | 7/2015 | Tanaka | H05K 7/20927 |
| | | | | 361/717 |
| 2019/0206757 | A1 * | 7/2019 | Hayashida | H01L 23/34 |
| 2020/0227333 | A1 * | 7/2020 | Tsuyuno | H01L 23/4334 |
| 2022/0122902 | A1 * | 4/2022 | Adachi | H01L 23/49811 |

(Continued)

FOREIGN PATENT DOCUMENTS

| | | |
|---|---|---|
| CN | 202918632 U | 5/2013 |
| CN | 107006136 A | 8/2017 |

*Primary Examiner* — Amir A Jalali
(74) *Attorney, Agent, or Firm* — Maier & Maier, PLLC (57) ABSTRACT

An electronic apparatus and a photovoltaic power optimizer. The electronic apparatus includes a circuit board, a heat dissipation housing, and an insulation member. The circuit board has a first surface and a second surface opposite to each other, where a first heat dissipation region is formed on the first surface and a second heat dissipation region is formed on the second surface. A first heat dissipation member has a first heat dissipation surface that is in direct contact with the first heat dissipation region. A second heat dissipation member is connected to the first heat dissipation member in a first direction, and has a second heat dissipation surface that is in direct contact with the second heat dissipation region. The first heat dissipation region and the second heat dissipation region are sealed by using the first heat dissipation member and the second heat dissipation member.

18 Claims, 4 Drawing Sheets

(56) References Cited

U.S. PATENT DOCUMENTS

| | | | |
|---|---|---|---|
| 2022/0192058 A1* | 6/2022 | Kim | H05K 7/20409 |
| 2023/0156903 A1* | 5/2023 | Teranishi | G06F 1/20 |
| | | | 361/704 |

* cited by examiner

ELECTRONIC APPARATUS AND PHOTOVOLTAIC POWER OPTIMIZER

CROSS-REFERENCE TO RELATED APPLICATIONS

This application claims priority to Chinese Patent Application No. 202211033886.0, filed on Aug. 26, 2022, which is hereby incorporated by reference in its entirety.

TECHNICAL FIELD

The embodiments relate to an electronic apparatus and a photovoltaic power optimizer.

BACKGROUND

A heat dissipation solution of a conventional electronic apparatus resolves an insulation problem before considering a heat dissipation problem. For example, a power switch device is covered with an insulation film, and then bonded to a heat sink to resolve a heat conduction problem. Alternatively, a power device is first bonded to a ceramic substrate to resolve an insulation problem, and then bonded to a heat sink to resolve a heat conduction problem. For insulation structures such as the insulation film and the ceramic substrate, it is difficult to consider heat conduction efficiency while ensuring insulation, resulting in poor heat dissipation effect of the electronic apparatus.

SUMMARY

The embodiments include an electronic apparatus and a photovoltaic power optimizer to improve heat dissipation performance of an electronic apparatus.

A first aspect of the embodiments provides an electronic apparatus, including a circuit board, a heat dissipation housing, and an insulation member. The circuit board has a first surface and a second surface opposite to each other, where a first heat dissipation region is formed on the first surface and a second heat dissipation region is formed on the second surface. The heat dissipation housing includes a first heat dissipation member and a second heat dissipation member. The insulation member wraps the heat dissipation housing. The first heat dissipation member has a first heat dissipation surface that is in direct contact with the first heat dissipation region. The second heat dissipation member is connected to the first heat dissipation member in a first direction, and has a second heat dissipation surface that is in direct contact with the second heat dissipation region. The first heat dissipation region and the second heat dissipation region are sealed by using the first heat dissipation member and the second heat dissipation member.

The first heat dissipation member and the second heat dissipation member of the electronic apparatus are both solid-state heat dissipation members, and maintain a fixed form when dissipating heat on the circuit board. This ensures stability of heat dissipation. The first heat dissipation member and the second heat dissipation member dissipate the heat on the circuit board by being in direct contact with the heat dissipation regions of the circuit board, to improve heat dissipation performance of the circuit board. On the basis of ensuring the heat dissipation performance of the circuit board, insulation performance of the electronic apparatus is improved by wrapping the heat dissipation housing by using the insulation member. A form of wrapping the heat dissipation housing by using the insulation member may not be a sealed wrap, and different wrapping forms may be selected based on an actual usage of the heat dissipation housing. For example, if a diameter of conductive sundries that may occur in a use environment is not less than 3 mm, the entire insulation housing wraps the heat dissipation housing, and the insulation housing may be provided with a hole less than 3 mm at a local position, so that heat dissipation performance of the electronic apparatus can be further improved. It can also prevent the conductive sundries from extending into the insulation housing and affecting the insulation performance of the electronic apparatus.

According to the first aspect, in a possible implementation, the insulation member includes the insulation housing, the insulation housing has a mounting cavity, and the heat dissipation housing is accommodated in the mounting cavity.

In this possible implementation, the electronic apparatus can be insulated based on the insulation housing, and the insulation housing and the heat dissipation housing may be separately manufactured for assembly.

According to the first aspect, in a possible implementation, the insulation housing is detachably connected to the heat dissipation housing.

In this possible implementation, the insulation housing may include a first sub-housing and a second sub-housing. The heat dissipation housing and the second sub-housing are first assembled, and then the first sub-housing and the second sub-housing are assembled, so that the insulation housing wraps the heat dissipation housing.

According to the first aspect, in a possible implementation, the insulation housing further has a heat dissipation channel in communication with the mounting cavity.

In this possible implementation, the mounting cavity of the insulation housing exchanges more gas with an environment outside the insulation housing, to improve heat dissipation in the mounting cavity.

According to the first aspect, in a possible implementation, the electronic apparatus further includes a gas driving member, the gas driving member is connected to the insulation housing, and the gas driving member is configured to drive gas to flow in the heat dissipation channel.

In this possible implementation, the gas driving member is used to actively drive the gas to flow, to further enhance the heat dissipation in the mounting cavity.

According to the first aspect, in a possible implementation, there is a ventilation gap between an inner wall of the mounting cavity and the heat dissipation housing.

In this possible implementation, the ventilation gap takes away heat of the heat dissipation housing by using flowing gas, to improve heat dissipation efficiency of the heat dissipation housing.

According to the first aspect, in a possible implementation, the insulation housing is provided with a first clamping part in the mounting cavity, the heat dissipation housing is provided with a second clamping part, and the first clamping part is clamped with the second clamping part to limit relative displacement between the insulation housing and the heat dissipation housing.

In this possible implementation, the heat dissipation housing and the insulation housing are fastened by using the first clamping part and the second clamping part, to reduce a risk that the heat dissipation housing shakes in the insulation housing.

According to the first aspect, in a possible implementation, the first clamping part includes an annular groove disposed in the mounting cavity, the second clamping part includes an annular protrusion disposed on an outer periphery of the heat dissipation housing, and the annular protrusion is accommodated in the annular groove.

In this possible implementation, the first clamping part and the second clamping part are not disposed on a first outer surface and a second outer surface, and do not occupy a heat dissipation area of the first outer surface and the second outer surface, so that heat dissipation effect of the heat dissipation housing can be improved.

According to the first aspect, in a possible implementation, the first heat dissipation member has a first outer surface opposite to the first heat dissipation surface, the second heat dissipation member has a second outer surface opposite to the second heat dissipation surface, the first outer surface and/or the second outer surface are/is covered with an insulation layer, and the insulation layer forms the insulation member.

In this possible implementation, the first heat dissipation member and the second heat dissipation member may not perform insulation processing by using the insulation housing, but directly cover surfaces of the first heat dissipation member and the second heat dissipation member with the insulation layer to implement insulation. Covering with an insulation layer may be implemented by pasting one layer of insulation film, coating one layer of insulation film, or the like.

According to the first aspect, in a possible implementation, the circuit board includes an electronic component, and the electronic component is located in the first heat dissipation region. The first heat dissipation surface has a giveaway slot, and the electronic component is accommodated in the giveaway slot.

In this possible implementation, for an uneven surface of the electronic component on which the electronic component is disposed, the first heat dissipation surface is provided with the giveaway slot to bypass the electronic component, so that the first heat dissipation surface may still be in contact with the first heat dissipation region on the first surface.

According to the first aspect, in a possible implementation, a heat dissipation filler is further included, where the heat dissipation filler fills a gap between an inner wall of the giveaway slot and the electronic component.

In this possible implementation, the heat dissipation filler may reduce thermal resistance from the electronic component to the first heat dissipation member. In addition, because the giveaway slot is enlarged to avoid the electronic component, a local region of the first heat dissipation surface cannot directly be in contact with the first heat dissipation region, and the heat dissipation filler may further reduce thermal resistance from the first heat dissipation region to the first heat dissipation member.

According to the first aspect, in a possible implementation, the first heat dissipation member has a first outer surface opposite to the first heat dissipation surface, the second heat dissipation member has a second outer surface opposite to the second heat dissipation surface, and a plurality of heat dissipation fins are disposed on the first outer surface and/or the second outer surface.

In this possible implementation, a surface area of the heat dissipation housing is increased by using the heat dissipation fins. This improves heat dissipation efficiency of the heat dissipation housing.

According to the first aspect, in a possible implementation, a metal region exists at peripheries of the first surface and the second surface, and the metal region is covered with a metal layer.

In this possible implementation, the metal layer may be used for electromagnetic shielding. In addition, when the metal layer is in contact with both the first heat dissipation member and the second heat dissipation member, the metal layer may accelerate heat conduction between the first heat dissipation member and the second heat dissipation member, and reduce a risk of local heat accumulation in the first heat dissipation member and the second heat dissipation member.

According to the first aspect, in a possible implementation, the metal region has a via that penetrates the first surface and the second surface.

In this possible implementation, the via may also implement connection between the first surface and the second surface, and a metal layer in the via may further enhance heat conduction efficiency of the first surface and the second surface.

According to the first aspect, in a possible implementation, the heat dissipation housing further includes a bolt, and the first heat dissipation member is connected to the second heat dissipation member by using the bolt.

In this possible implementation, the first heat dissipation member and the second heat dissipation member are detachably connected, and the first heat dissipation member or the second heat dissipation member may be separately replaced in subsequent maintenance. The first heat dissipation member and the second heat dissipation member may be connected by using the bolt in a plurality of forms. For example, both the first heat dissipation member and the second heat dissipation member are provided with a via, and the bolt is connected to a nut after passing through the first heat dissipation member and the second heat dissipation member. For another example, the first heat dissipation member is provided with a threaded hole, the second heat dissipation member is provided with a via, and the bolt is threadedly connected to the threaded hole of the first heat dissipation member after passing through the second heat dissipation member.

According to the first aspect, in a possible implementation, the circuit board is provided with a mounting via, and the bolt passes through the mounting via.

In this possible implementation, the bolt further passes through the circuit board, and in an extension direction perpendicular to the bolt, a relative position of the circuit board and the heat dissipation housing may be further fastened by using the bolt.

According to the first aspect, in a possible implementation, the heat dissipation housing further includes a sealing ring, the sealing ring is sandwiched between the first heat dissipation member and the second heat dissipation member, and the circuit board is located in the sealing ring.

In this possible implementation, the sealing ring compensates for a tolerance between the first heat dissipation member and the second heat dissipation member, and the sealing ring is used to seal an outer periphery of the circuit board, to implement waterproof and moisture-proof of the circuit board.

According to the first aspect, in a possible implementation, the first heat dissipation member and the second heat dissipation member are welded and fastened.

In this possible implementation, the first heat dissipation member and the second heat dissipation member have high connection strength, and circumferential welding around the first heat dissipation member and the second heat dissipation member can also enhance waterproof and moisture-proof of the circuit board.

According to the first aspect, in a possible implementation, the first heat dissipation member and/or the second heat dissipation member are/is metal heat dissipation members/a metal heat dissipation member.

In this possible implementation, the first heat dissipation member and the second heat dissipation member improve heat dissipation effects of the first heat dissipation member and the second heat dissipation member by using high thermal conductivity of a metal. In addition, the metal heat dissipation member is easy to process, to reduce processing costs.

According to the first aspect, in a possible implementation, a clamping flange is disposed in the heat dissipation housing, and the clamping flange is in contact with an outer periphery of the circuit board to restrict movement of the circuit board relative to the heat dissipation housing.

In this possible implementation, positions of the circuit board and the first heat dissipation member or the second heat dissipation member may be fastened in advance by using the clamping flange, and then the first heat dissipation member and the second heat dissipation member are fastened.

A second aspect of the embodiments provides a photovoltaic power optimizer. The photovoltaic power optimizer includes a connection cable and the electronic apparatus in any implementation of the first aspect. One end of the connection cable is electrically connected to a circuit board, and the other end extends out of an insulation member to form a connector. The connector is configured to connect a photovoltaic module.

The photovoltaic power optimizer is configured to connect the photovoltaic module to track a maximum power point of the photovoltaic module in real time. In addition, the photovoltaic power optimizer ensures stability of heat dissipation by using a first heat dissipation member and a second heat dissipation member in the electronic apparatus. The first heat dissipation member and the second heat dissipation member dissipate the heat on the circuit board in the form of being in direct contact with the heat dissipation regions of the circuit board to improve the heat dissipation performance of the circuit board. On the basis of ensuring the heat dissipation performance of the circuit board, the insulation performance of the electronic apparatus is improved by wrapping the heat dissipation housing by using the insulation member.

The following embodiments are further described with reference to the accompanying drawings.

DETAILED DESCRIPTION OF EMBODIMENTS

The following describes implementations by using specific embodiments. A person skilled in the art may easily understand other advantages and effects of the embodiments based on content herein. Although described with reference to an example embodiment, it does not mean that a characteristic is limited only to this implementation or embodiment. On the contrary, a purpose of describing the embodiments with reference to an implementation is to cover another option or modification that may be derived based on the embodiments. To provide an in-depth understanding of the embodiments, the following includes a variety of specific details. This embodiments may be alternatively implemented without using these details. In addition, to avoid confusion or blurring a focus, some specific details are omitted from the description. It should be noted that embodiments and the features in embodiments may be mutually combined in the case of no conflict.

The following terms "first", "second", and the like are merely used for description, and shall not be understood as an indication or implication of relative importance or implicit indication of a quantity of indicated features. Therefore, a feature limited by "first", "second", or the like may explicitly or implicitly include one or more features. Unless otherwise stated, "a plurality of" means two or more than two. Orientation terms such as "up", "down", "left", and "right" are defined relative to an orientation of schematic placement of components in the accompanying drawings. It should be understood that these directional terms are relative concepts and are used for relative description and clarification. These directional terms may vary accordingly depending on an orientation in which the components are placed in the accompanying drawings.

Unless otherwise explicitly specified and limited, a term "connection" should be understood in a broad sense. For example, the "connection" may be a fastened connection, a detachable connection, or an integrated connection; and may be a direct connection or an indirect connection by using an intermediate medium. The term "and/or" includes any and all combinations of one or more related listed items.

When the following embodiments are described in detail with reference to schematic diagrams, for ease of description, a diagram indicating a partial structure of a component is partially enlarged not based on a general scale. In addition, the schematic diagrams are merely examples, and should not be interpreted as limiting.

Figure 1:
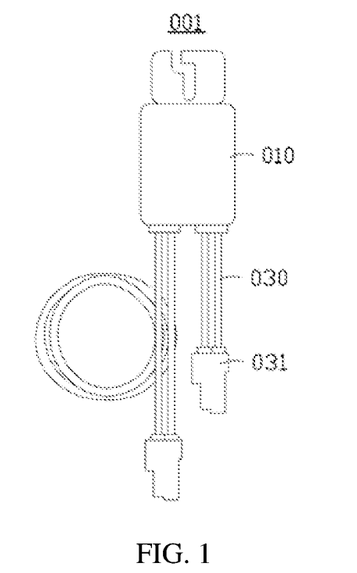
FIG. 1 is a schematic diagram of a structure of a photovoltaic power optimizer according to an embodiment.
Figure 2:
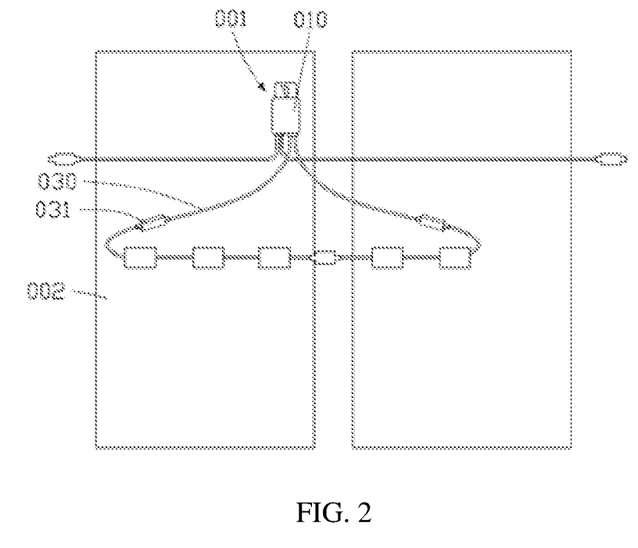
FIG. 2 is a schematic diagram of a structure of a photovoltaic power optimizer connected to a photovoltaic module according to an embodiment.

To make the objectives, solutions, and advantages clearer, the following further describes the implementations in detail with reference to the accompanying drawings. FIG. 1 is a schematic diagram of a structure of a photovoltaic power optimizer 001 according to an implementation. FIG. 2 is a schematic diagram of a structure of the photovoltaic power optimizer 001 connected to a photovoltaic module 002 according to an implementation.

As shown in FIG. 1, the photovoltaic power optimizer 001 includes an electronic apparatus 010 and a cable. One end of the cable is connected to the electronic apparatus 010, and the other end forms a connector 031. Refer to FIG. 2. Based on a soft feature of the cable, after the electronic apparatus 010 is fastened, the connector 031 of the cable may be pulled to a position of the photovoltaic module 002 to connect the photovoltaic module 002. After the connector 031 of the cable is connected to the photovoltaic module 002, the electronic apparatus 010 is electrically connected to the photovoltaic module 002. After the electronic apparatus 010 is electrically connected to the photovoltaic module 002, the electronic apparatus 010 may track a maximum power point of the photovoltaic module 002, to optimize power of the photovoltaic module 002. The photovoltaic power optimizer 001 may have a plurality of cables, so that a plurality of photovoltaic modules 002 are simultaneously connected by using one electronic apparatus 010, to simultaneously track maximum power points of the plurality of photovoltaic modules 002.

Figure 3:
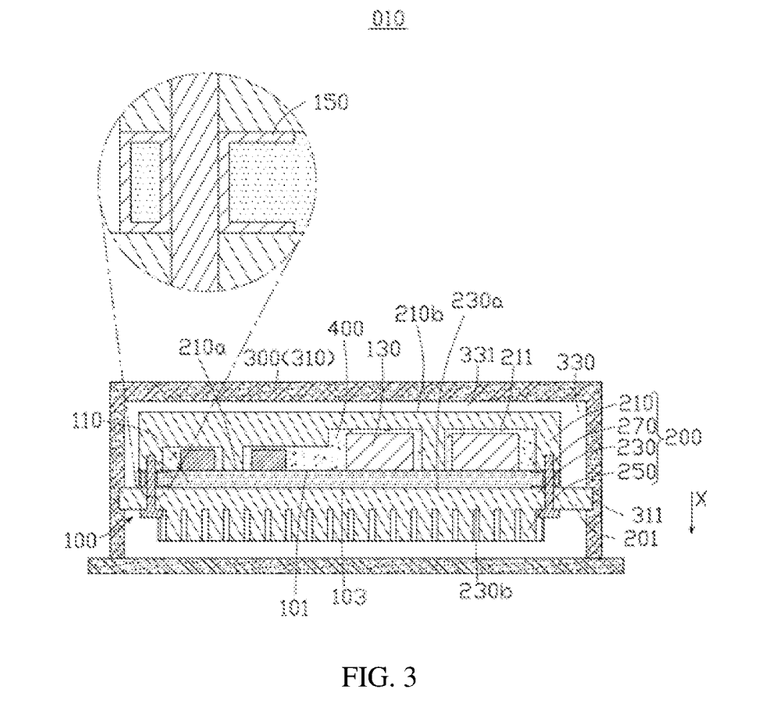
FIG. 3 is a cross-sectional view of an electronic apparatus according to an embodiment.

FIG. 3 is a cross-sectional view of the electronic apparatus 010 according to an implementation.

As shown in FIG. 3, the electronic apparatus 010 includes a circuit board 100 and a heat dissipation housing 200. The circuit board 100 includes a plate body 110 having a first surface and a second surface opposite in a first direction. The first surface has a first heat dissipation region 101, and the first heat dissipation region 101 is located in a central part of the first surface. The second surface has a second heat dissipation region 103, and the second heat dissipation region 103 is located in a central part of the second surface. The heat dissipation housing 200 includes a first heat dissipation member 210 and a second heat dissipation member 230, and the first heat dissipation member 210 and the second heat dissipation member 230 sandwich the circuit board 100 in the first direction. Optionally, the first heat dissipation member 210 is integrally formed, and has uniform thermal conductivity. Similarly, the second heat dissipation member 230 is integrally formed, and has uniform thermal conductivity.

A surface that is of the first heat dissipation member 210 and that faces the second heat dissipation member 230 is a first heat dissipation surface 210a, and the first heat dissipation surface 210a is in direct contact with the first heat dissipation region 101. Heat of the first heat dissipation region 101 may be directly conducted to the first heat dissipation member 210, and discharged through the first heat dissipation member 210. A surface that is of the second heat dissipation member 230 and that faces the first heat dissipation member 210 is a second heat dissipation surface 230a, and the second heat dissipation surface 230a is in direct contact with the second heat dissipation region 103. Heat of the second heat dissipation region 103 may be directly conducted to the second heat dissipation member 230, and discharged through the second heat dissipation member 230.

The first heat dissipation member 210 is connected to the second heat dissipation member 230 in the first direction. For example, the first heat dissipation member 210 and the second heat dissipation member 230 are respectively disposed on two sides of the circuit board 100 in the first direction. After the first heat dissipation member 210 is connected to the second heat dissipation member 230, the circuit board 100 is sandwiched in the first direction.

Optionally, the heat dissipation housing 200 further includes a bolt 270, the first heat dissipation member 210 is provided with a threaded hole, the second heat dissipation member 230 is provided with a via, and the bolt 270 passes through the via of the second heat dissipation member 230 and is threadedly connected to the threaded hole of the first heat dissipation member 210. In this way, the first heat dissipation member 210 is connected to the second heat dissipation member 230. There are at least two bolts 270, and the at least two bolts 270 are connected to the first heat dissipation member 210 and the second heat dissipation member 230 to further limit rotation of the first heat dissipation member 210 relative to the second heat dissipation member 230 around any bolt 270. It may be understood that the via may also be disposed on both the first heat dissipation member 210 and the second heat dissipation member 230, and the bolt 270 passes through vias of the first heat dissipation member 210 and the second heat dissipation member 230 and is connected to a nut, to fasten the first heat dissipation member 210 and the second heat dissipation member 230.

Figure 4:
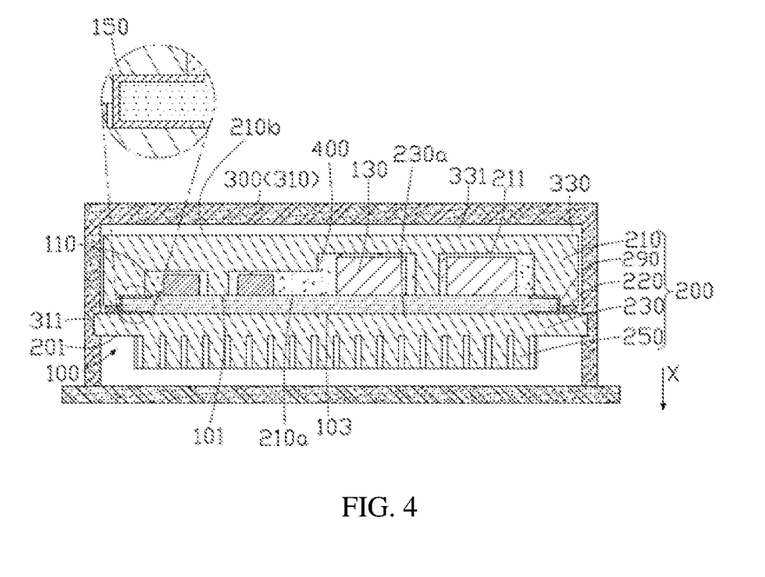
FIG. 4 is a cross-sectional view of an electronic apparatus according to an embodiment.

FIG. 4 is a cross-sectional view of the electronic apparatus 010 according to an implementation.

Refer to FIG. 4. Alternatively, in addition to connecting the first heat dissipation member 210 and the second heat dissipation member 230 by using the bolt 270, the first heat dissipation member 210 may be connected to the second heat dissipation member 230 in a form of welding. After the first heat dissipation member 210 and the second heat dissipation member 230 press the circuit board 100 in the first direction, the first heat dissipation member 210 and the second heat dissipation member 230 are fastened in the form of welding. A welding seam 220 may surround the entire first heat dissipation member 210 and the second heat dissipation member 230, and sealing of the first heat dissipation region 101 and the second heat dissipation region 103 is strengthened by using the annular welding seam 220.

In this form, the first heat dissipation member 210 is provided with an annular clamping flange 290 on an outer periphery, and the clamping flange 290 is in contact with an outer periphery of the circuit board 100. The clamping flange 290 has a wall surface that is substantially parallel to the first direction and that matches an outer peripheral contour of the circuit board 100. When the outer periphery of the circuit board 100 is in contact with the wall surface of the clamping flange 290, the clamping flange 290 may limit a relative position of the circuit board 100 with the first heat dissipation member 210 in a direction perpendicular to the first direction. After the circuit board 100 is clamped in the clamping flange 290, the first heat dissipation member 210 and the second heat dissipation member 230 are welded. It may be understood that the clamping flange 290 may alternatively be disposed on the second heat dissipation member 230.

Figure 5:
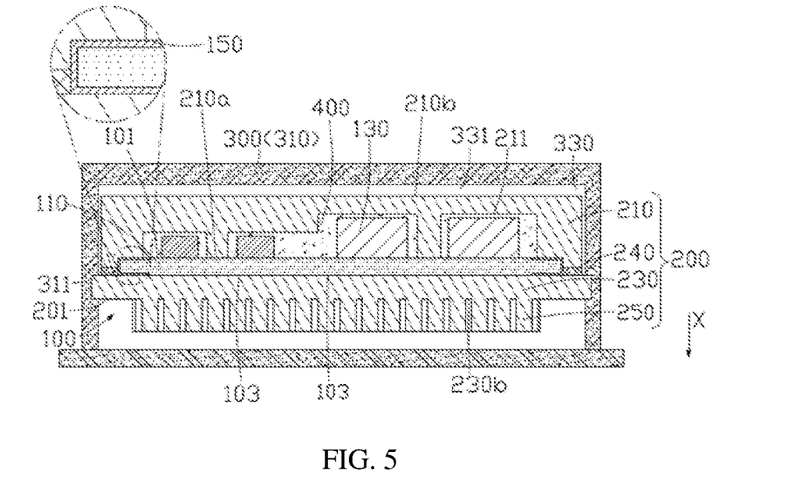
FIG. 5 is a cross-sectional view of an electronic apparatus according to an embodiment.

FIG. 5 is a cross-sectional view of the electronic apparatus 010 according to an implementation.

Refer to FIG. 5. Optionally, a sealing ring 240 may be further disposed between the first heat dissipation member 210 and the second heat dissipation member 230. The sealing ring 240 is sandwiched between the first heat dissipation member 210 and the second heat dissipation member 230, and the circuit board 100 is located in the sealing ring 240. The sealing ring 240 may further enhance sealing performance of the first heat dissipation region 101 and the second heat dissipation region 103.

Optionally, when the sealing ring 240 is sandwiched between the first heat dissipation member 210 and the second heat dissipation member 230, an external force may be applied to the first heat dissipation member 210 and the second heat dissipation member 230 by using an insulation housing 310, so that the first heat dissipation member 210 and the second heat dissipation member 230 approach each other and press the sealing ring 240. In this way, relative positions of the first heat dissipation member 210 and the second heat dissipation member 230 are fastened, and the first heat dissipation region 101 and the second heat dissipation region 103 are sealed. It may be understood that the sealing ring 240 may also be disposed between the first heat dissipation member 210 and the second heat dissipation member 230 that are connected by using the bolt 270, to enhance sealing of the first heat dissipation region 101 and the second heat dissipation region 103. Additionally, before the first heat dissipation member 210 and the second heat dissipation member 230 are welded, the sealing ring 240 may be placed first to enhance sealing performance of the first heat dissipation member 210 and the second heat dissipation member 230.

Refer to FIG. 3 The first heat dissipation member 210 has a first outer surface 210b opposite to the first heat dissipation surface 210a, and the second heat dissipation member 230 has a second outer surface 230b opposite to the second heat dissipation surface 230a. The first outer surface 210b is a plane, and the second outer surface 230b is provided with a plurality of heat dissipation fins 250. The heat dissipation fin 250 may increase a surface area of the second heat dissipation member 230 to accelerate heat dissipation of the second heat dissipation member 230. It may be understood that the plurality of heat dissipation fins 250 may also be disposed on the first outer surface 210b to accelerate heat dissipation of the first heat dissipation member 210. The heat dissipation fin 250 may be integrally formed with the first heat dissipation member 210 or the second heat dissipation member 230.

The circuit board 100 further includes an electronic component 130, and the electronic component 130 is fastened to the plate body 110. The electronic component 130 is located on the first surface. The electronic component 130 may be a component such as a resistor or a capacitor. An expected function is implemented by connecting the electronic component 130 to the plate body 110. The first heat dissipation member 210 has a giveaway slot 211 on the first heat dissipation surface 210a, and the giveaway slot 211 is correspondingly disposed to the electronic component 130. When the first heat dissipation member 210 is in direct contact with the first heat dissipation region 101, the electronic component 130 is accommodated in the giveaway slot 211. There is a specific gap between the giveaway slot 211 and the electronic component 130, and the gap decreases heat transfer efficiency. The electronic apparatus 010 further includes a heat dissipation filler 400. The heat dissipation filler 400 is filled in the gap to perform heat transfer, and converts gas heat conduction in the gap part into solid heat conduction, to improve heat transfer efficiency. It should be noted that, that the heat dissipation filler 400 is a hard solid structure is not defined by the solid heat conduction herein. The heat dissipation filler 400 may be deformable silicone grease.

It may be understood that a quantity of electronic components 130 on the circuit board 100 is variable, and a form in which the giveaway slot 211 corresponds to the electronic component 130 may be in a one-to-one correspondence, or one giveaway slot 211 may correspond to a plurality of electronic components 130.

Figure 6:
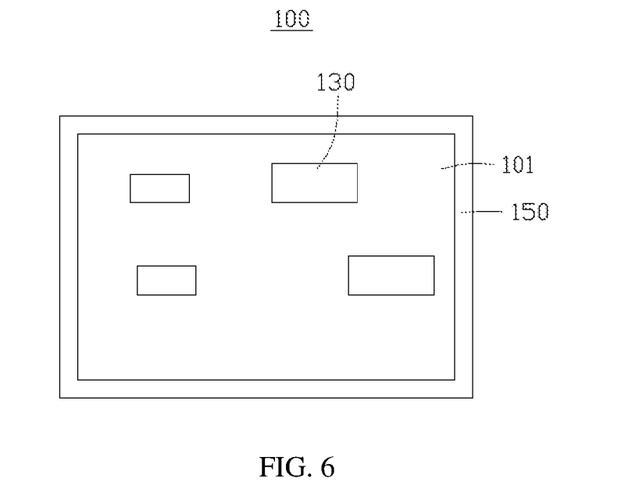
FIG. 6 is a schematic diagram of a structure of a circuit board according to an embodiment.
Figure 7:
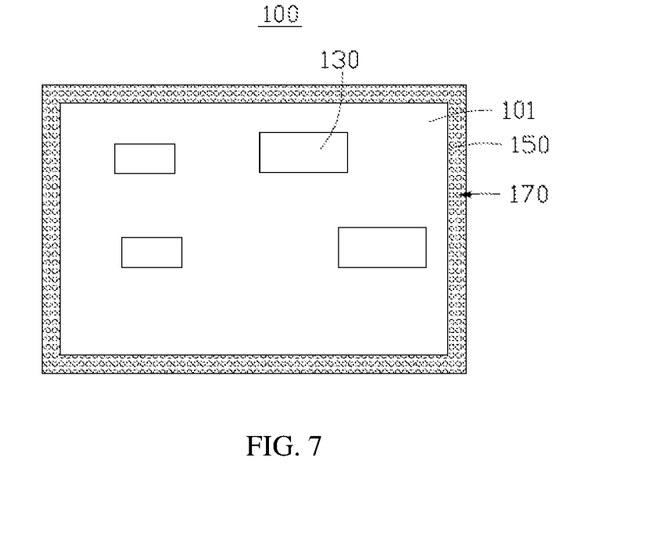
FIG. 7 is a schematic diagram of a structure of a circuit board according to an embodiment.

FIG. 6 is a schematic diagram of a structure of the circuit board 100 according to an implementation. FIG. 7 is a schematic diagram of a structure of the circuit board 100 according to another implementation.

As shown in FIG. 3 and FIG. 6, the plate body 110 further has a metal region at peripheries of the first surface and the second surface. The metal region is located outside the first heat dissipation region 101 and the second heat dissipation region 103. The metal region is annular, the first heat dissipation region 101 and the second heat dissipation region 103 are located inside the metal region, and a specific shape of the metal region may be determined based on a shape of the plate body 110. As shown in FIG. 6, the plate body 110 of the circuit board 100 is square, and the metal region at a periphery of the plate body 110 is square annular. The metal region is covered with a metal layer 150, the metal layer 150 on the first surface is sealed and connected to the first heat dissipation member 210, and the metal layer 150 on the second surface is sealed and connected to the second heat dissipation member 230. Therefore, sealing of the first heat dissipation region 101 and the second heat dissipation region 103 is strengthened, and waterproof and moisture-proof performance of the first heat dissipation region 101 and the second heat dissipation region 103 is improved.

The metal region includes an edge part of the plate body 110. When the metal region covers the metal layer 150, the metal layer 150 on the first surface is integrally formed with the metal layer 150 on the second surface. The metal layer 150 can implement electromagnetic shielding on a side of the circuit board 100. In addition, the metal layer 150 on the first surface can implement fast heat conduction with the metal layer 150 on the second surface, so that heat transfer between the first heat dissipation member 210 and the second heat dissipation member 230 is fast, and a risk of local heat accumulation in the first heat dissipation member 210 and the second heat dissipation member 230 is reduced.

As shown in FIG. 7, the circuit board 100 further has vias 170 passing through the first surface and the second surface in the metal region. The metal layer 150 may also be disposed in the via 170. On one hand, the metal layer 150 in the via 170 may implement an electrical connection of interlayers of the circuit board 100, and on the other hand, may further enhance heat conduction efficiency between the first surface and the second surface.

Optionally, the metal layer 150 is a copper layer, and covers the metal region in a form of copper deposition. The copper layer has advantages, at least, of high thermal conductivity and easy formation.

It may be understood that a specific shape of the metal region may alternatively be determined based on shapes of the first heat dissipation member 210 and the second heat dissipation member 230. For example, if the plate body 110 of the circuit board 100 is square, but the first heat dissipation member 210 and the second heat dissipation member 230 are circular, and the first heat dissipation member 210 and the second heat dissipation member 230 may cover the first heat dissipation region 101 and the second heat dissipation region 103, the metal region may also be set to be annular. The metal layer 150 is covered by using the metal region, and the first heat dissipation member 210 and the second heat dissipation member 230 are attached to the metal layer 150, so that sealing of the first heat dissipation region 101 and the second heat dissipation region 103 can be further enhanced.

Refer to FIG. 3. When the first heat dissipation member 210 is connected to the second heat dissipation member 230 by using the bolt 270, the circuit board 100 is further provided with a mounting via, and the mounting via is used for the bolt 270 to pass through. After passing through the via of the second heat dissipation member 230 and the mounting via of the circuit board 100, the bolt 270 is threadedly connected to the threaded hole of the first heat dissipation member 210, to implement a connection between the first heat dissipation member 210, the circuit board 100, and the second heat dissipation member 230. The bolt 270 passes through the circuit board 100 in the first direction. In a plane direction perpendicular to the first direction, relative positions of the circuit board 100 and the heat dissipation housing 200 may be fastened by using the bolt 270. In this way, relative positions of the first heat dissipation member 210, the circuit board 100, and the second heat dissipation member 230 are stable.

The electronic apparatus 010 further includes an insulation member 300. The insulation member 300 wraps the heat dissipation housing 200 to implement environment insulation between the heat dissipation housing 200 and the outside of the insulation member 300. The insulation member 300 includes the insulation housing 310.

The insulation housing 310 has a mounting cavity 330, the heat dissipation housing 200 is accommodated in the mounting cavity 330, and the heat dissipation housing 200 is wrapped by using the insulation housing 310. A form of wrapping the heat dissipation housing 200 by using the insulation member 300 may not be a sealed wrap, and different wrapping forms may be selected based on an actual usage of the heat dissipation housing 200. For example, if a diameter of conductive sundries that may occur in a use environment is not less than 3 mm, the entire insulation housing 310 wraps the heat dissipation housing 200, and the insulation housing 310 may be provided with a hole less than 3 mm at a local position, so that heat dissipation performance of the heat dissipation housing 200 can be further improved through gas exchange inside and outside the mounting cavity 330. It can also prevent the conductive sundries from extending into the insulation housing 310 and affecting insulation performance of the electronic apparatus 010.

Optionally, the insulation housing 310 further includes a heat dissipation channel (not shown in the figure). The heat dissipation channel may be a serpentine channel. When a fluid is injected into the heat dissipation channel, the fluid flows through the heat dissipation channel, and heat of the insulation housing 310 may be taken away.

It may be understood that the electronic apparatus 010 may further include a gas driving member (not shown in the figure), and the gas driving member is connected to the insulation housing 310. Flowing gas is poured into the heat dissipation channel by using the gas driving member. Alternatively, the electronic apparatus 010 may include a liquid-cooled pump, and the liquid-cooled pump flows coolant into the heat dissipation channel, thereby implementing rapid heat dissipation of the insulation housing 310.

Still refer to FIG. 3. There is a ventilation gap 331 between an inner wall of the mounting cavity 330 of the insulation housing 310 and the heat dissipation housing 200. For example, there is a part of the ventilation gap 331 between the inner wall of the mounting cavity 330 and the first heat dissipation member 210, and there is also a part of the ventilation gap 331 between the inner wall of the mounting cavity 330 and the second heat dissipation member 230. If gas flows through the ventilation gap 331, heat dissipation of the first heat dissipation member 210 and the second heat dissipation member 230 can be accelerated.

The insulation housing 310 is provided with a first clamping part 311 in the mounting cavity 330, and the heat dissipation housing 200 is provided with a second clamping part 201. Relative positions of the insulation housing 310 and the heat dissipation housing 200 are fastened by clamping the first clamping part 311 and the second clamping part 201. Optionally, the first clamping part 311 includes an annular groove disposed in the mounting cavity 330, and the second clamping part 201 includes an annular protrusion disposed on an outer periphery of the second heat dissipation member 230. The annular protrusion is accommodated in the annular groove, thereby limiting relative movement of the heat dissipation housing 200 and the insulation housing 310 in the first direction. When the annular protrusion and the annular groove are non-circular annular, the heat dissipation housing 200 may be further restricted from rotating around an axis parallel to the first direction in the insulation housing 310.

It may be understood that the insulation housing 310 may include a first sub-housing and a second sub-housing. The first sub-housing and the second sub-housing are connected in the first direction, and the first sub-housing and the second sub-housing are combined to form the annular groove. When the heat dissipation housing 200 and the insulation housing 310 are assembled, the heat dissipation housing 200 and the second sub-housing may be assembled first, and then the first sub-housing and the second sub-housing are connected to form the insulation housing 310. The second clamping part 201 extends along the outer periphery of the second heat dissipation member 230, and occupies a heat dissipation area of the second outer surface 230b. This reduces impact of the second clamping part 201 on heat dissipation performance of the second heat dissipation member 230.

It may be understood that a connection form between the insulation housing 310 and the heat dissipation housing 200 may also be set as follows: the first clamping part 311 is the annular protrusion disposed on the inner wall of the mounting cavity 330, and the second clamping part 201 is the annular groove disposed on the outer periphery of the second heat dissipation member 230. The first clamping part 311 is inserted into the second clamping part 201.

In some other embodiments, the insulation member 300 may also be an insulation film covering the first outer surface 210b and the second outer surface 230b. The insulation film may be formed on the first outer surface 210b and the second outer surface 230b through pasting, coating, or the like.

It may be understood that in the electronic apparatus 010, the first heat dissipation member 210 and the second heat dissipation member 230 may be metal heat sinks, and are made of metal materials. Fast heat dissipation of the circuit board 100 is implemented by using high thermal conductivity of the metal. Alternatively, the first heat dissipation member 210 and the second heat dissipation member 230 may be made of other materials with high thermal conductivity, for example, non-metallic materials with high thermal conductivity such as aluminum nitride and boron nitride.

When the electronic apparatus 010 is in use, the circuit board 100 emits heat in the first heat dissipation region 101 and the second heat dissipation region 103, and the heat is directly conducted to the first heat dissipation member 210 and the second heat dissipation member 230. Because the first heat dissipation member 210 and the second heat dissipation member 230 are integrally formed, thermal resistance is low. The first heat dissipation member 210 and the second heat dissipation member 230 can quickly transfer heat of the first heat dissipation region 101 and the second heat dissipation region 103 to the first outer surface 210b and the second outer surface 230b. Heat dissipation is further implemented through heat dissipation of the first outer surface 210b and the second outer surface 230b. The heat dissipation of the first outer surface 210b and the second outer surface 230b may be implemented based on air flow in the ventilation gap 331. Further, the first heat dissipation region 101 and the second heat dissipation region 103, in which heat is generated, of the circuit board 100, are concentrated locations of the electronic component 130 and a printed circuit. Based on the sealing of the first heat dissipation region 101 and the second heat dissipation region 103 by the first heat dissipation member 210 and the second heat dissipation member 230, the electronic component 130 and the printed circuit of the circuit board 100 can further be protected, and a risk of short circuit of the circuit board 100 can be reduced. Sealing the first heat dissipation region 101 and the second heat dissipation region 103 may be implemented by pressing the outer periphery of the circuit board 100, and the first heat dissipation member 210 and the second heat dissipation member 230 in the embodiment shown in FIG. 3, or may be implemented by completely wrapping the circuit board 100 by using the first heat dissipation member 210 and the second heat dissipation member 230 in embodiments shown in FIG. 4 and FIG. 5. On a basis that the first heat dissipation member 210 and the second heat dissipation member 230 dissipate heat and seal the circuit board 100, the heat dissipation housing 200 wraps the insulation housing 310 to improve insulation performance of the electronic apparatus 010, thereby ensuring normal running of the electronic apparatus 010.

By selecting materials of the first heat dissipation member 210 and the second heat dissipation member 230, heat dissipation effect of the electronic apparatus 010 may be further adjusted. Based on different materials having different thermal conductivity, heat transfer efficiency of the first heat dissipation member 210 and the second heat dissipation member 230 is adjusted.

In the photovoltaic power optimizer 001, the first heat dissipation member 210 and the second heat dissipation member 230 are both solid-state heat dissipation members, and maintain a fixed form when dissipating heat on the circuit board 100. This ensures stability of heat dissipation. The first heat dissipation member 210 and the second heat dissipation member 230 dissipate the heat on the circuit board 100 in the form of being in direct contact with the heat dissipation regions of the circuit board 100, to improve heat dissipation performance of the circuit board 100. On the basis of ensuring the heat dissipation performance of the circuit board 100, the insulation performance of the electronic apparatus 010 is improved by wrapping the heat dissipation housing 200 by using the insulation member 300.

The foregoing description is merely an implementations of this embodiments, but is not intended as limiting. Any variation or replacement of the scope of the embodiments herein shall fall within the scope of the embodiments.

What is claimed is:

1. An electronic apparatus, comprising:
    a circuit board having a first surface and a second surface opposite to each other, wherein a first heat dissipation region is provided on the first surface and a second heat dissipation region is provided on the second surface;
    a heat dissipation housing, comprising a first heat dissipation member and a second heat dissipation member; and
    an insulation member, wrapping the heat dissipation housing, wherein
    the first heat dissipation member has a first heat dissipation surface, and the first heat dissipation surface is in direct contact with the first heat dissipation region;
    the second heat dissipation member is connected to the first heat dissipation member, the second heat dissipation member has a second heat dissipation surface, and the second heat dissipation surface is in direct contact with the second heat dissipation region; and
    the first heat dissipation region and the second heat dissipation region are sealed by using the first heat dissipation member and the second heat dissipation member.

2. The electronic apparatus according to claim 1, wherein the insulation member comprises an insulation housing, the insulation housing has a mounting cavity, and the heat dissipation housing is accommodated in the mounting cavity.

3. The electronic apparatus according to claim 2, wherein there is a ventilation gap between an inner wall of the mounting cavity and the heat dissipation housing.

4. The electronic apparatus according to claim 2, wherein the insulation housing is provided with a first clamping part in the mounting cavity, the heat dissipation housing is provided with a second clamping part, and the first clamping part is clamped with the second clamping part to limit relative displacement between the insulation housing and the heat dissipation housing.

5. The electronic apparatus according to claim 1, wherein the first heat dissipation member has a first outer surface opposite to the first heat dissipation surface, the second heat dissipation member has a second outer surface opposite to the second heat dissipation surface, the first outer surface and/or the second outer surface are/is covered with an insulation layer, and the insulation layer forms the insulation member.

6. The electronic apparatus according to claim 1, wherein the circuit board comprises an electronic component, and the electronic component is located in the first heat dissipation region; and
    the first heat dissipation surface has a giveaway slot, and the electronic component is accommodated in the giveaway slot.

7. The electronic apparatus according to claim 6, further comprising a heat dissipation filler, wherein the heat dissipation filler fills a gap between an inner wall of the giveaway slot and the electronic component.

8. The electronic apparatus according to claim 1, wherein the first heat dissipation member has a first outer surface opposite to the first heat dissipation surface, the second heat dissipation member has a second outer surface opposite to the second heat dissipation surface, and a plurality of heat dissipation fins are disposed on the first outer surface and/or the second outer surface.

9. The electronic apparatus according to claim 1, wherein a metal region exists at peripheries of the first surface and the second surface, and the metal region is covered with a metal layer.

10. The electronic apparatus according to claim 1, wherein the heat dissipation housing further comprises a bolt, and the first heat dissipation member is connected to the second heat dissipation member by using the bolt.

11. The electronic apparatus according to claim 10, wherein the circuit board is provided with a mounting via, and the bolt passes through the mounting via.

12. The electronic apparatus according to claim 1, wherein the heat dissipation housing further comprises a sealing ring, the sealing ring is sandwiched between the first heat dissipation member and the second heat dissipation member, and the circuit board is located in the sealing ring.

13. The electronic apparatus according to claim 1, wherein a clamping flange is disposed in the heat dissipation housing, and the clamping flange is in contact with an outer periphery of the circuit board to restrict movement of the circuit board relative to the heat dissipation housing.

14. A photovoltaic power optimizer, comprising; a connection cable and an electronic apparatus, wherein
    one end of the connection cable is electrically connected to a circuit board, and the other end extends out of an insulation member to form a connector;
    the connector is configured to connect a photovoltaic module;
    and the electronic apparatus comprises:
    the circuit board having a first surface and a second surface opposite to each other, wherein a first heat dissipation region is provided on the first surface and a second heat dissipation region is provided on the second surface;

a heat dissipation housing, comprising a first heat dissipation member and a second heat dissipation member; and an insulation member, wrapping the heat dissipation housing, wherein the first heat dissipation member has a first heat dissipation surface, and the first heat dissipation surface is in direct contact with the first heat dissipation region;

the second heat dissipation member is connected to the first heat dissipation member, the second heat dissipation member has a second heat dissipation surface, and the second heat dissipation surface is in direct contact with the second heat dissipation region; and the first heat dissipation region and the second heat dissipation region are sealed by using the first heat dissipation member and the second heat dissipation member.

15. The photovoltaic power optimizer according to claim 14, wherein the insulation member comprises an insulation housing, the insulation housing has a mounting cavity, and the heat dissipation housing is accommodated in the mounting cavity.

16. The photovoltaic power optimizer according to claim 15, wherein there is a ventilation gap between an inner wall of the mounting cavity and the heat dissipation housing.

17. The photovoltaic power optimizer according to claim 15, wherein the insulation housing is provided with a first clamping part in the mounting cavity, the heat dissipation housing is provided with a second clamping part, and the first clamping part is clamped with the second clamping part to limit relative displacement between the insulation housing and the heat dissipation housing.

18. The photovoltaic power optimizer according to claim 14, wherein the first heat dissipation member has a first outer surface opposite to the first heat dissipation surface, the second heat dissipation member has a second outer surface opposite to the second heat dissipation surface, the first outer surface and/or the second outer surface are/is covered with an insulation layer, and the insulation layer forms the insulation member.

* * * * *